(12) United States Patent
Yamamoto

(10) Patent No.: US 11,387,805 B2
(45) Date of Patent: Jul. 12, 2022

(54) ELECTRONIC COMPONENT

(71) Applicant: Murata Manufacturing Co., Ltd., Nagaokakyo (JP)

(72) Inventor: Hiroyuki Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 135 days.

(21) Appl. No.: 16/804,096

(22) Filed: Feb. 28, 2020

(65) Prior Publication Data
US 2020/0204153 A1 Jun. 25, 2020

Related U.S. Application Data

(63) Continuation of application No. PCT/JP2018/033511, filed on Sep. 10, 2018.

(30) Foreign Application Priority Data

Sep. 22, 2017 (JP) .............................. JP2017-182998

(51) Int. Cl.
*H03H 9/10* (2006.01)
*H03H 3/02* (2006.01)
*H03H 9/13* (2006.01)

(52) U.S. Cl.
CPC ................ *H03H 9/10* (2013.01); *H03H 3/02* (2013.01); *H03H 9/13* (2013.01)

(58) Field of Classification Search
CPC .......... H03H 9/10; H03H 9/13; H03H 9/0121; H03H 9/0509; H03H 3/02; H03H 2003/022
See application file for complete search history.

(56) References Cited

U.S. PATENT DOCUMENTS

2014/0346930 A1* 11/2014 Kohda ................. H03H 9/1021
    310/344
2015/0054385 A1    2/2015 Kaida et al.

FOREIGN PATENT DOCUMENTS

JP    H0496353 A    3/1992
JP    H06151619 A   5/1994
(Continued)

OTHER PUBLICATIONS

Machine Translation of JP 2009088309 (Year: 2009).*
(Continued)

*Primary Examiner* — Jeffrey M Shin
(74) *Attorney, Agent, or Firm* — ArentFox Schiff LLP

(57) ABSTRACT

An electronic component includes a metal cap including a first main-surface having a flat plate-like shape with a first main surface and an annular portion that has an annular shape and that surrounds the first main surface when viewed in a direction perpendicular to the first main surface. The first main-surface and the annular portion forming a recess. A substrate is provided having a flat plate-like shape with a second main surface that hermetically seals the recess, a joining member that joins the cap and the substrate to each other, with an element accommodated in the recess. An outer peripheral surface of the annular portion has a band-shaped region between the first and second main surfaces in the direction perpendicular to the first main surface. A groove is formed in the band-shaped region that extends in a circumferential direction of the annular portion.

20 Claims, 6 Drawing Sheets

(56) References Cited

FOREIGN PATENT DOCUMENTS

| | | | | |
|---|---|---|---|---|
| JP | H07321591 | A | 12/1995 | |
| JP | 2009088309 | * | 4/2009 | ... H01L 2924/16152 |
| JP | 2009088309 | A | 4/2009 | |
| JP | 5862770 | B2 | 2/2016 | |

OTHER PUBLICATIONS

International Search Report issued for PCT/JP2018/033511, dated Nov. 20, 2018.
Written Opinion of the International Searching Authority issued for PCT/JP2018/033511, dated Nov. 20, 2018.

* cited by examiner

ELECTRONIC COMPONENT

CROSS REFERENCE TO RELATED APPLICATIONS

The present application is a continuation of PCT/JP2018/033511 filed Sep. 10, 2018, which claims priority to Japanese Patent Application No. 2017-182998, filed Sep. 22, 2017, the entire contents of each of which are incorporated herein by reference.

TECHNICAL FIELD

The present invention relates to an electronic component that includes a metal cap.

BACKGROUND

An exemplary crystal resonator described in Patent Document 1 (identified below) is known as an electronic component that includes a metal cap. FIG. 9 is a diagram illustrating the sectional structure of a crystal resonator 150 described in Patent Document 1. As shown, the crystal resonator 150 includes a substrate 151, a crystal resonator element 152, and a cap 153. The cap 153 has a dome-shaped structure with a flat top. The cap 153 is joined to the substrate 151 such that the crystal resonator element 152 is accommodated in a space enclosed by the cap 153 and the substrate 151. Moreover, the cap 153 has a side wall 153a that surrounds the crystal resonator element 152, a ceiling 153b that is positioned above the crystal resonator element 152, and a connecting portion 153c that connects the side wall 153a and the ceiling 153b to each other. The connecting portion 153c has a thickness smaller than that of the side wall 153a and that of the ceiling 153b.

In this design, the thermal expansion coefficient of the cap 153 and the thermal expansion coefficient of the substrate 151 are different from each other. Thus, when the temperature of the crystal resonator 150 changes, stress is generated both in the cap 153 and in the substrate 151 and the stress remains in the cap 153 and the substrate 151. Moreover, the stress remaining in the substrate 151 is applied to the crystal resonator element 152 mounted on the substrate 151. When the stress remaining in the substrate 151 changes, the magnitude of the stress applied to the crystal resonator element 152 also changes. As a result, frequency accuracy of the crystal resonator element 152 deteriorates over usage.

Accordingly, in the crystal resonator 150 described in the Patent Document 1, since the connecting portion 153c has a thickness smaller than that of the side wall 153a and that of the ceiling 153b, the cap 153 may easily be deformed when stress is applied to the cap 153. Consequently, the stress remaining in the substrate 151 and the cap 153 decreases as a result of deformation of the cap 153. When the stress remaining in the substrate 151 decreases, the stress that is applied to the crystal resonator element 152 from the substrate 151 decreases. As a result, a high frequency accuracy of the crystal resonator element 152 can be achieved.

Moreover, another example of a crystal resonator is described in Patent Document 2.
Patent Document 1: Japanese Patent No. 5862770.
Patent Document 2: Japanese Unexamined Patent Application Publication No. 7-321591.

When the crystal resonator 150 described in Patent Document 1 is mounted onto a mother substrate, the crystal resonator 150 is held by a nozzle N of a mounter. More specifically, the nozzle N has a flat bottom surface, and a suction hole Nh is formed in the bottom surface. By performing suction under reduced pressure through the suction hole Nh, the ceiling 153b of the cap 153 is sucked to the bottom surface of the nozzle N. After that process, the crystal resonator 150 is pressed against the mother substrate by the nozzle N. In this case, in the crystal resonator 150, a large stress may sometimes be applied to a joint between the cap 153 and the substrate 151. Under this process, such stress becomes a cause of breakage of the joint.

In recent years, crystal resonators have been decreasing in size. Accordingly, the width Wn of the bottom surface of the nozzle N (i.e., a surface of the nozzle N that faces the cap 153) is usually larger than the width We of the cap 153. Thus, when the crystal resonator 150 is mounted onto the mother substrate, the entire ceiling 153b is pressed by the nozzle N. As a result, deformation of the connecting portion 153c does not easily occur. Consequently, the stress that is applied from the nozzle N to the joint between the substrate 151 and the cap 153 via the cap 153 is not sufficiently reduced. Therefore, the joint can possibly break in this configuration and process.

SUMMARY OF THE INVENTION

Accordingly, it is an object of the present invention to provide an electronic component having a joint between a cap and a substrate that is durable and that does not easily break when the electronic component is mounted onto a mother substrate.

As such, an electronic component according to an exemplary aspect includes a metal cap having a first main-surface having a flat plate-like shape with a first main surface and an annular portion that has an annular shape and that surrounds the first main surface when viewed in a direction perpendicular to the first main surface. Moreover, the first main-surface and the annular portion form a recess. A substrate is provided having a flat plate-like shape with a second main surface that hermetically seals the recess, a joining member joining the cap and the substrate to each other, and an element is accommodated in the recess. An outer peripheral surface of the annular portion has a band-shaped region between the first main surface and the second main surface in the direction perpendicular to the first main surface. Furthermore, a groove is formed in the band-shaped region so as to extend in a circumferential direction of the annular portion.

In an electronic component according to the exemplary embodiment, a joint between a cap and a substrate is durable and does not easily break when the electronic component is mounted onto a mother substrate.

DETAILED DESCRIPTION OF EMBODIMENTS (Structure of Crystal Resonator)

Figure 1:
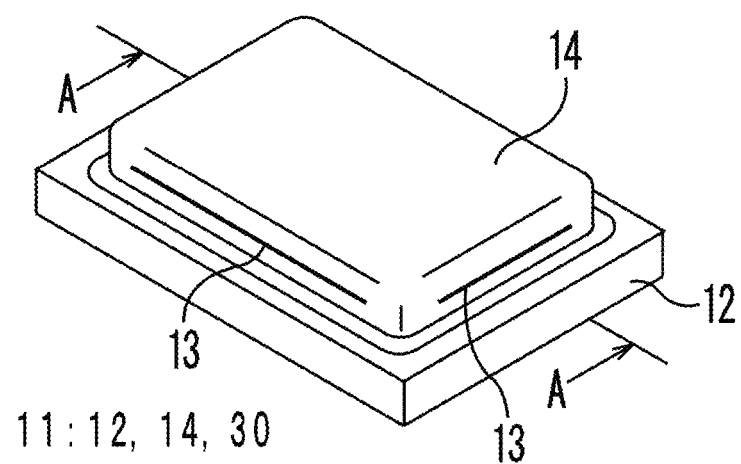
FIG. 1 is an external perspective view of a crystal resonator 10.
Figure 1:
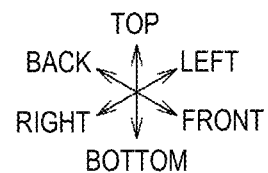
Figure 2:
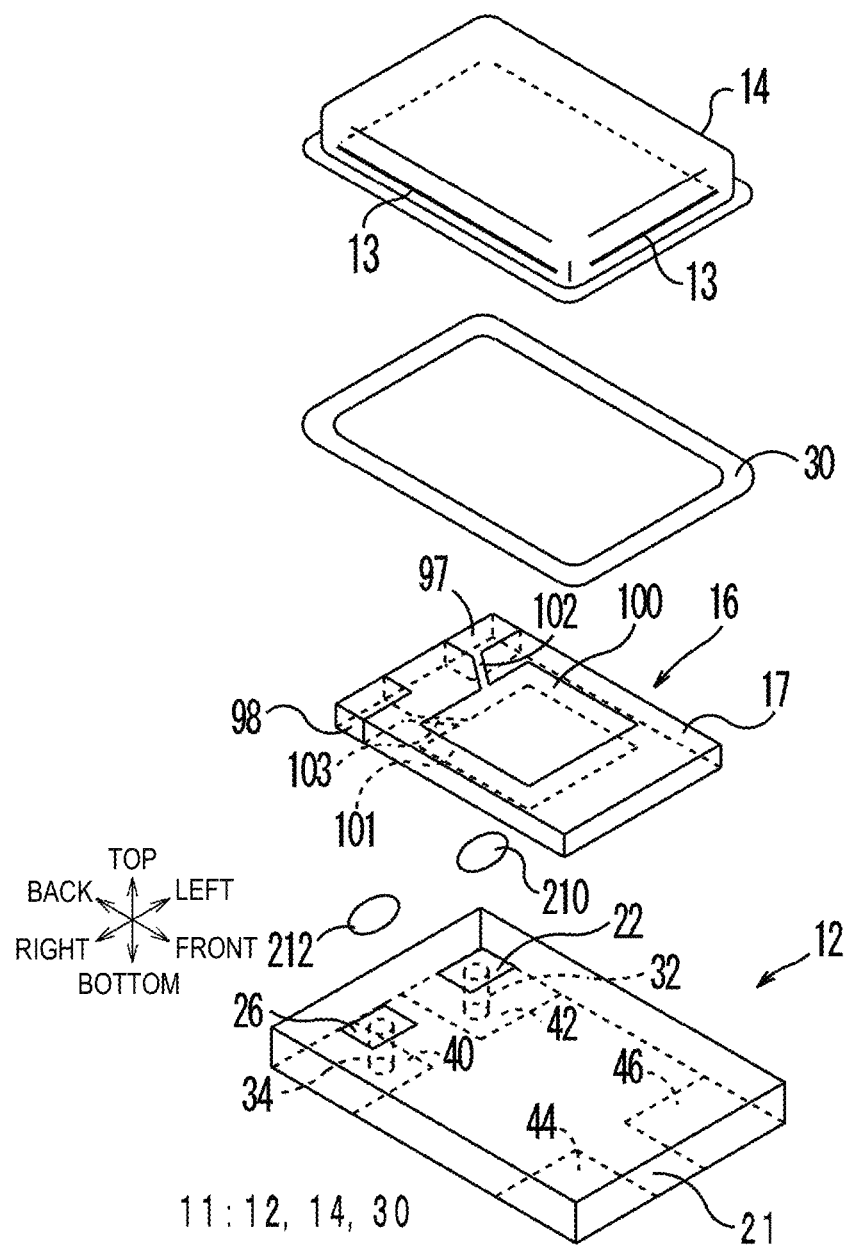
FIG. 2 is an exploded perspective view of the crystal resonator 10.
Figure 3:
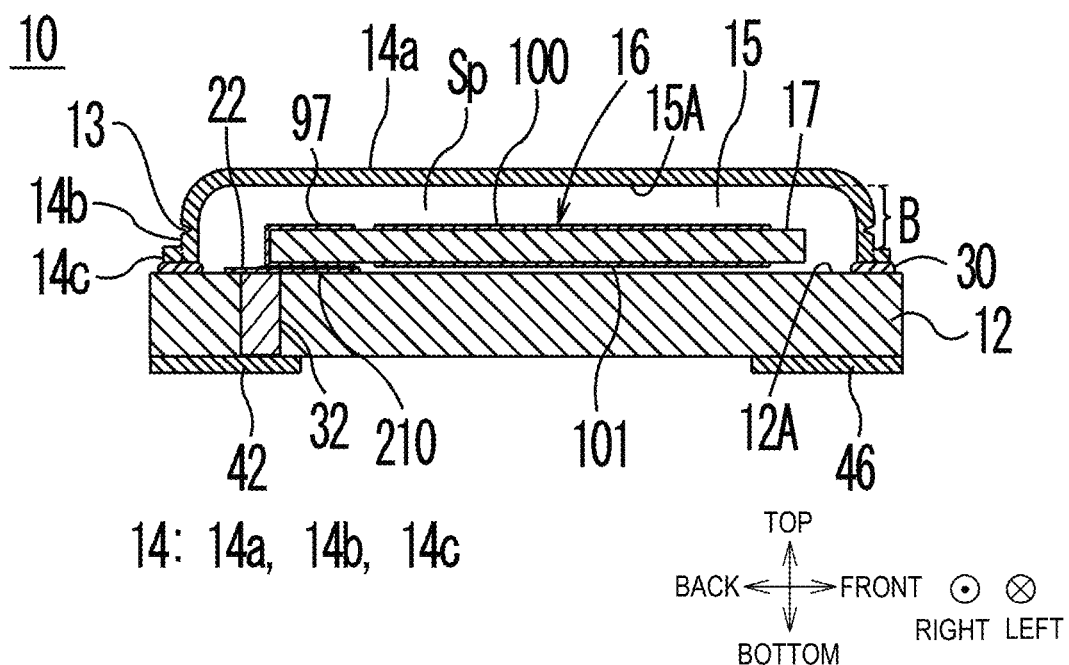
FIG. 3 is a diagram illustrating the sectional structure taken along line A-A of FIG. 1.

A crystal resonator that corresponds to an electronic component according to an exemplary embodiment of the present invention will be described below with reference to the drawings. FIG. 1 is an external perspective view of a crystal resonator 10. FIG. 2 is an exploded perspective view of the crystal resonator 10. FIG. 3 is a diagram illustrating the sectional structure taken along line A-A of FIG. 1.

In the following description, a direction normal to a main surface of the crystal resonator 10 will be defined as the vertical direction, and when the crystal resonator 10 is viewed from above, a direction in which the long sides of the crystal resonator 10 extend and a direction in which the short sides of the crystal resonator 10 extend will be respectively defined as the longitudinal direction and the transverse direction. The vertical, longitudinal and transverse directions are relative to each other and used for purposes of description the orientation of components of the crystal resonator 10 with respect to each other.

As illustrated in FIG. 1 to FIG. 3, the crystal resonator 10 includes a holding unit 11 and a crystal resonator element 16 and is an example of a piezoelectric vibrator. In an exemplary aspect, the holding unit 11 includes a substrate 12, a cap 14, and a brazing-alloy member (e.g., an example of a joining member) 30 and is a hermetically-sealed container having a rectangular-parallelepiped-shaped structure. A space Sp (i.e., an internal space) is formed in the holding unit 11 so as to be isolated and sealed from the outside. The holding unit 11 has an airtight structure and a liquid-tight structure. In other words, the space Sp is airtightly and liquid-tightly sealed. Thus, a gas (e.g., steam) and a liquid (e.g., water) cannot flow between the outside of the holding unit 11 and into the space Sp.

The substrate 12 includes a substrate main body 21, outer electrodes 22, 26, 40, 42, 44, and 46 and via conductors 32 and 34.

The substrate main body 21 has a plate-like structure, and when viewed from above, the substrate main body 21 has a rectangular structure. Thus, the substrate main body 21 has a top surface and a bottom surface each having a rectangular shape. For purposes of this disclosure, the term "rectangular shape" includes a square shape. In addition, the term "rectangular shape" can include a shape obtained by slightly deforming a rectangle as well as a rectangular shape. In an exemplary aspect, the substrate main body 21 is made of a ceramic-based insulating material such as an aluminum oxide sintered compact, a mullite sintered compact, an aluminum nitride sintered compact, a silicon carbide sintered compact, or a glass ceramic sintered compact, a quartz crystal, glass, or silicon, for example. Moreover, the substrate main body 21 is made of an aluminum oxide sintered compact.

The outer electrode 22 is a rectangular conductor layer provided in the vicinity of the left rear corner of the top surface of the substrate main body 21. Similarly, the outer electrode 26 is a rectangular conductor layer provided in the vicinity of the right rear corner of the top surface of the substrate main body 21. The outer electrode 22 and the outer electrode 26 are arranged in the transverse direction in the exemplary embodiment.

The outer electrode 40 is a square conductor layer provided in the vicinity of the right rear corner of the bottom surface of the substrate main body 21. Likewise, the outer electrode 42 is a square conductor layer provided in the vicinity of the left rear corner of the bottom surface of the substrate main body 21. Similarly, the outer electrode 44 is a square conductor layer provided in the vicinity of the right front corner of the bottom surface of the substrate main body 21. Finally, the outer electrode 46 is a square conductor layer provided in the vicinity of the left front corner of the bottom surface of the substrate main body 21.

In the exemplary embodiment, each of the outer electrodes 22, 26, 40, 42, 44, and 46 has a three-layer structure, and specifically is formed of a molybdenum layer, a nickel layer, and a metal layer laminated one on top of the other in this order from a lower-layer side to an upper-layer side.

The via conductors 32 and 34 extend through the substrate main body 21 in a thickness direction of the substrate main body 21 (i.e., the vertical direction or from top to bottom as shown in FIG. 3). The via conductor 32 connects the outer electrode 22 and the outer electrode 42 to each other. Likewise, the via conductor 34 connects the outer electrode 26 and the outer electrode 40 to each other. The via conductors 32 and 34 are each made of a conductor such as molybdenum, for example.

The cap 14 is a metal housing having a rectangular parallelepiped shape that is open at the bottom. The cap 14 includes a main-surface 14a (an example of a first main-surface), an annular portion 14b, and a flange 14c. The main-surface 14a, the annular portion 14b, and the flange 14c are formed as an integral member. More specifically, as will be described later, the main-surface 14a, the annular portion 14b, and the flange 14c are formed as a result of bending a single piece of metal plate by drawing.

The cap 14 includes a base member and a plating layer provided on a surface of the base member. The base member is made of, for example, an iron-nickel alloy (e.g., an iron-nickel alloy having a nickel content of 42% by mass) or an iron-nickel-cobalt alloy (e.g., Kovar). The plating layer has a two-layer structure formed of a nickel layer serving as a base and a metal layer provided on the nickel layer. In the present embodiment, the cap 14 is formed by performing nickel plating and gold plating on a surface of the base member made of an iron-nickel alloy.

As shown, the main-surface 14a has a flat plate-like shape. For purposes of this disclosure, regarding the main-surface 14a, the term "flat plate-like shape" includes the shape of a flat plate and also a shape obtained by slightly deforming a flat plate, which is, for example, a shape having a slightly curved main surface. The annular portion 14b includes four plate-shaped portions each extending in a direction substantially perpendicular to the main-surface 14a. The main-surface 14a and the annular portion 14b form a recess 15 in the cap 14 (see FIG. 3). As such, the cap 14 has a rectangular opening. A bottom (or inner) surface 15A (e.g., an example of a first main surface) of the main-surface 14a is the bottom surface of the recess 15. The flange 14c projects from an opening edge (i.e., outer edge) of the annular portion 14b in a direction along the bottom surface 15A of the main-surface 14a (a direction approximately parallel to the main-surface 14a) and toward the outside of the recess 15.

Figure 4:
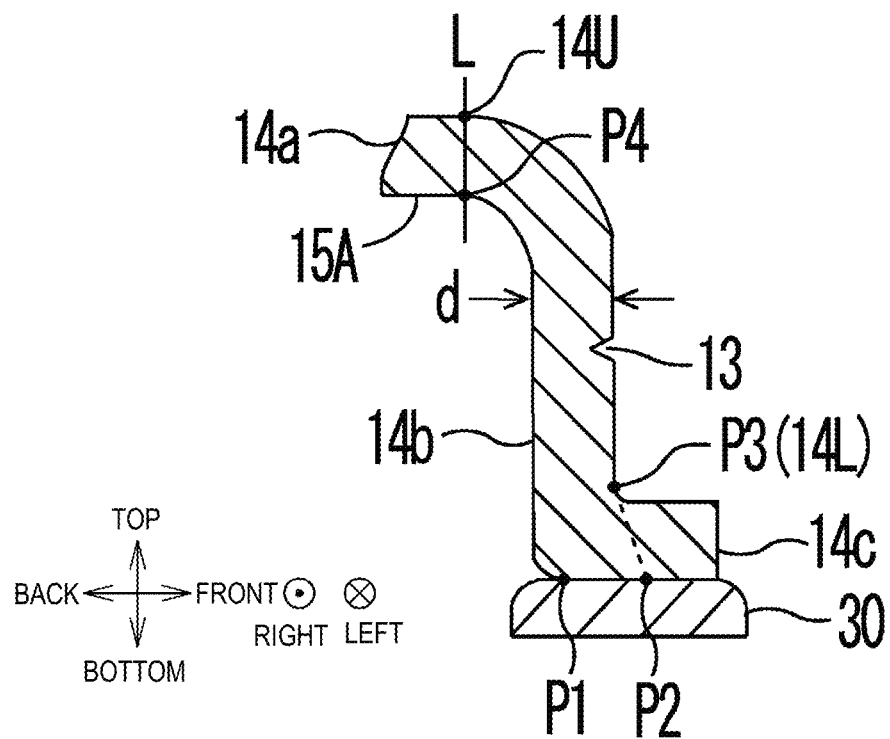
FIG. 4 is a diagram illustrating the sectional structure in the vicinity of an annular portion 14b in an enlarged manner.

FIG. 4 is a diagram illustrating the sectional structure in the vicinity of the annular portion 14b, which is illustrated in FIG. 3, in an enlarged manner. The boundary between the annular portion 14b and the flange 14c in the cap 14 will now be described with reference to FIG. 4. This cross section is parallel to the thickness directions of the main-surface 14a, the annular portion 14b, and the flange 14c.

A region that is located at the lower end of the cap 14 and that extends parallel to the bottom surface 15A will hereinafter be referred to as a parallel region. The parallel region is oriented downward. In the parallel region, the innermost point (located on the back side in FIG. 4) in the cap 14 will be denoted by reference sign P1. In the parallel region, a point that is spaced apart from the point P1 by a distance corresponding to a thickness d of the annular portion 14b toward the outside (i.e., toward the front side in FIG. 4) will be denoted by reference sign P2. In a path extending downward on the outer surface of a lower portion of the cap 14, a point where the outer surface starts to bend will be denoted by reference sign P3. In the cross section illustrated in FIG. 4, a portion of the cap 14 that is located further toward the outside than a line segment connecting the point P2 and the point P3 is will be defined as the flange 14c. A portion of the cap 14 that is contiguous with the flange 14c is a portion of the annular portion 14b.

The boundary between the annular portion 14b and the main-surface 14a in the cap 14 will now be described. Referring to FIG. 4, in the inner surface of the cap 14, in a path extending from an inner region toward an outer region of the bottom surface 15A, a point where the inner surface of the cap 14 starts to bend will be denoted by reference sign P4. A portion of the cap 14 that is located further toward the inside than a straight line L that passes through the point P4 and that is perpendicular to the bottom surface 15A is will be defined as the main-surface 14a. A portion of the cap 14 that is contiguous with the main-surface 14a is a portion of the annular portion 14b.

In the outer surface of the cap 14, a region between a point where the straight line L intersects the outer surface of the cap 14 and the point P3 will hereinafter be referred to as the outer peripheral surface of the annular portion 14b. Surfaces of the flange 14c that are, for example, a top surface and an end surface of the flange 14c are not included in the outer peripheral surface of the annular portion 14b. The point where the straight line L intersects the outer surface of the cap 14 will be referred to as an upper-end-side edge 14U of the annular portion 14b, and the point P3 will be referred to as a lower-end-side edge 14L of the annular portion 14b. In the outer peripheral surface of the annular portion 14b, a region between the bottom surface 15A and a top surface (e.g., an example of a second main surface) 12A of the substrate 12 in a direction perpendicular to the bottom surface 15A of the main-surface 14a (i.e., the vertical direction) will be referred to as a band-shaped region B (see FIG. 3).

Figure 5:
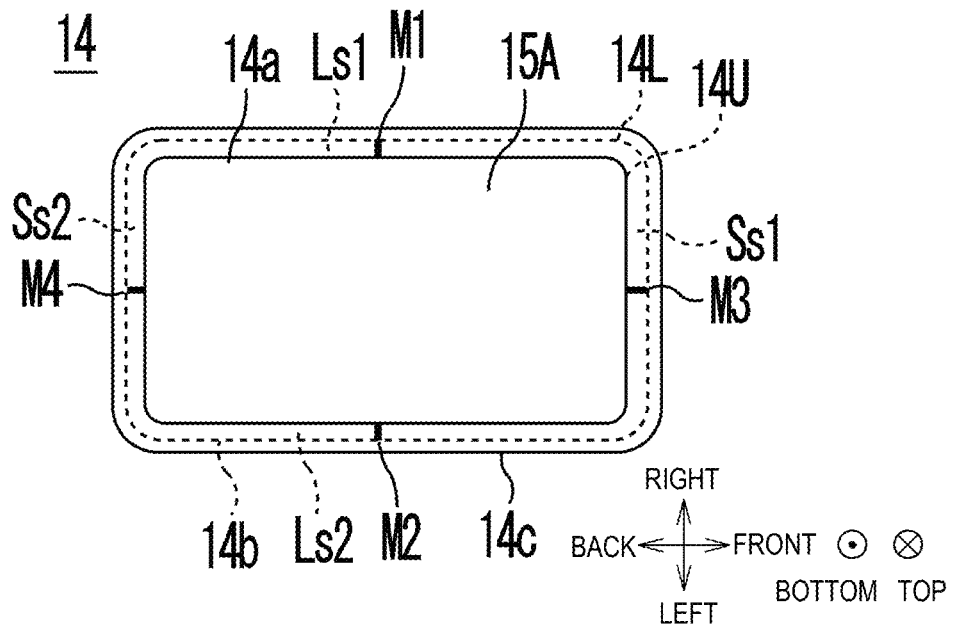
FIG. 5 is a plan view of a cap 14.

FIG. 5 is a plan view of the cap 14 when viewed in a direction perpendicular to the bottom surface 15A of the main-surface 14a (i.e., when viewed from below). In the plan view illustrated in FIG. 5, the annular portion 14b has an annular structure surrounding the bottom surface 15A. The flange 14c has a rectangular annular structure surrounding the bottom surface 15A and the annular portion 14b.

In the plan view, the lower-end-side edge 14L is located further toward the outside than the upper-end-side edge 14U is. The upper-end-side edge 14U and the lower-end-side edge 14L each have a rectangular shape having a pair of long sides and a pair of short sides. Thus, the annular portion 14b has a rectangular shape having a pair of long side Ls1 and Ls2 and a pair of short side Ss1 and Ss2. When viewed from below, the long side Ls1 is a linear region between one of the two long sides of the upper-end-side edge 14U, the one long side being located on the right-hand side, and one of the two long sides of the lower-end-side edge 14L, the one long side being located on the right-hand side. When viewed from below, the long side Ls2 is a linear region between one of the two long sides of the upper-end-side edge 14U, the one long side being located on the left-hand side, and one of the two long sides of the lower-end-side edge 14L, the one long side being located on the left-hand side. When viewed from below, the short side Ss1 is a linear region between one of the two short sides of the upper-end-side edge 14U, the one short side being located on the front side, and one of the two short sides of the lower-end-side edge 14L, the one short side being located on the front side. When viewed from below, the short side Ss2 is a linear region between one of the two short sides of the upper-end-side edge 14U, the one short side being located on the back side, and one of the two short sides of the lower-end-side edge 14L, the one short side being located on the back side.

As illustrated in FIG. 3, in the band-shaped region B, a groove 13 is formed so as to extend in the circumferential direction of the annular portion 14b. for purposes of this disclosure, the description of the groove 13 formed so as to extend in the circumferential direction of the annular portion 14b refers to the configuration where the groove 13 is positioned within the outer peripheral surface of the annular portion 14b and where the angle between a horizontal plane (i.e., a plane parallel to the longitudinal direction and the transverse direction, that is, a plane including the bottom surface 15A) and a direction in which the groove 13 extends is within a range of ±60°. It is noted that it is preferable that the angle between the horizontal plane and the direction in which the groove 13 extends be within a range of ±30°, and more preferably, within a range of ±15°, and it is further preferable that the horizontal plane be approximately parallel to the direction in which the groove 13 extends.

In the exemplary embodiment, as illustrated in FIG. 1 and FIG. 2, the groove 13 is formed in regions excluding portions in the vicinity of the corners of the annular portion 14b. When the cap 14 is viewed in the vertical direction, the groove 13 is formed in regions including an intermediate portion M1 of the long side Ls1, an intermediate portion M2 of the long side Ls2, an intermediate portion M3 of the short side Ss1, and an intermediate portion M4 of the short side Ss2 (see, e.g., FIG. 5). When viewed in the vertical direction, the intermediate portion M1 is a line segment connecting a midpoint of one of the two long sides of the upper-end-side edge 14U, the one long side being located on the right-hand side, and a midpoint of one of the two long sides of the lower-end-side edge 14L, the one long side being located on the right-hand side. When viewed in the vertical direction, the intermediate portion M2 is a line segment connecting a midpoint of one of the two long sides of the upper-end-side edge 14U, the one long side being located on the left-hand side, and a midpoint of one of the two long sides of the lower-end-side edge 14L, the one long side being located on the left-hand side. When viewed in the vertical direction, the intermediate portion M3 is a line segment connecting a midpoint of one of the two short sides of the upper-end-side edge 14U, the one short side being located on the front side, and a midpoint of one of the two short sides of the lower-end-side edge 14L, the one short side being located on the front side. When viewed in the vertical direction, the intermediate portion M4 is a line segment connecting a midpoint of one of the two short sides of the upper-end-side edge 14U, the one short side being located on the back side, and a midpoint of one of the two short sides of the lower-end-side edge 14L, the one short side being located on the back side. Accordingly, when the groove 13 is formed in the regions including the intermediate portions M1 to M4, the groove 13 crosses the intermediate portions M1 to M4 (i.e., the line segments).

It is preferable that the groove 13 be a so-called V-groove, that is, it is preferable that the angle formed by two inner-wall surfaces at the bottom of the groove 13 be an acute angle in a cross section perpendicular to the direction in which the groove 13 extends. However, in the cross section perpendicular to the direction in which the groove 13 extends, the bottom of the groove 13 may have a round shape in an alternative aspect.

The brazing-alloy member 30 has a rectangular annular structure and surrounds the crystal resonator element 16 and the outer electrodes 22 and 26 when viewed from above. For example, the brazing-alloy member 30 is made of a gold-tin alloy or a tin-lead alloy. The brazing-alloy member 30 serves to join the substrate 12 and the cap 14 to each other. The brazing-alloy member 30 is melted and solidified in a state where the opening edge portion of the cap 14 is placed on the edge of the substrate 12 with the brazing-alloy member 30 interposed therebetween. As a result, the whole periphery of the opening edge of the cap 14 is joined to the top surface 12A of the substrate 12. In the manner described above, the recess 15 is hermetically sealed by the top surface 12A of the substrate 12. As a result, the top surface 12A of the substrate main body 21 and the cap 14 form the space Sp.

In the exemplary aspect, a joining member made of a material different from the material of the brazing-alloy member 30 can be used instead of the brazing-alloy member 30 depending on the characteristics required for the crystal resonator 10. For example, in the case where the crystal resonator 10 is required to have an airtight structure and is not required to have a liquid-tight structure, an adhesive containing an organic substance as a main material may be used as the brazing-alloy member 30.

The crystal resonator element 16 is accommodated in the holding unit 11 so as to be configured to be excited during operation. As shown in FIG. 2, for example, the crystal resonator element 16 includes a quartz-crystal blank 17, outer electrodes 97 and 98, excitation electrodes 100 and 101, and extended conductors 102 and 103 and is an example of a piezoelectric vibration element. Moreover, the quartz-crystal blank 17 has a plate-like structure with a top surface and a bottom surface, and when viewed from above, the quartz-crystal blank 17 has a rectangular structure. Alternatively, as a piezoelectric vibration element, a piezoelectric ceramic element may be used instead of the crystal resonator element 16. In this case, as a piezoelectric piece, a piezoelectric ceramic piece can be used instead of the quartz-crystal blank 17.

The quartz-crystal blank 17 is made of a quartz crystal having a predetermined crystal orientation and is, for example, an AT-cut quartz-crystal blank cut out from quartz-crystal ore or the like at a predetermined angle. For example, the size of the quartz-crystal blank 17 is set within a range in which the length of the quartz-crystal blank 17 in the longitudinal direction is 2.0 mm or smaller and in which the width of the quartz-crystal blank 17 in the transverse direction is 1.6 mm or smaller. Considering the wall thickness of the holding unit 11, exudation of a sealing material, the accuracy with which an element is mounted, and so forth, the quartz-crystal blank 17 is designed such that the length of the quartz-crystal blank 17 in the vertical direction is 1.500 mm or smaller and that the width of the quartz-crystal blank 17 in the transverse direction is 1.00 mm or smaller.

According to an exemplary aspect, the outer electrode 97 is a conductor layer provided on the left rear corner and peripheral portion of the quartz-crystal blank 17. The outer electrode 97 is formed so as to extend to the top surface, the bottom surface, the rear surface, and the left surface of the quartz-crystal blank 17. The outer electrode 98 is a conductor layer provided on the right rear corner and peripheral portion of the quartz-crystal blank 17. The outer electrode 98 is formed so as to extend to the top surface, the bottom surface, the rear surface, and the right surface of the quartz-crystal blank 17. As a result, the outer electrodes 97 and 98 are arranged in the transverse direction, that is, along the short sides of the quartz-crystal blank 17.

The excitation electrode 100 is provided at the center of the top surface of the quartz-crystal blank 17 and has a rectangular structure when viewed from above. The excitation electrode 101 is provided at the center of the bottom surface of the quartz-crystal blank 17 and has a rectangular structure when viewed from above. The excitation electrode 100 and the excitation electrode 101 are superposed with each other such that the outer edge of the excitation electrode 100 and the outer edge of the excitation electrode 101 coincide with each other when viewed from above the quartz-crystal blank 17.

The extended conductor 102 is provided on the top surface of the quartz-crystal blank 17 and connects (i.e., electrically) the outer electrode 97 and the excitation electrode 100 to each other. The extended conductor 103 is provided on the bottom surface of the quartz-crystal blank 17 and connects (i.e., electrically) the outer electrode 98 and the excitation electrode 101 to each other. The outer electrodes 97 and 98, the excitation electrodes 100 and 101, and the extended conductors 102 and 103 each have a two-layer structure and each include a chrome layer and a metal layer in an exemplary aspect. The chrome layers are provided on the surfaces of the quartz-crystal blank 17. The metal layers are surface metal layers provided on the chrome layers. The adhesive strength of each of the metal layers with respect to the quartz-crystal blank 17 is low. Thus, the chrome layers are provided between the metal layers and the quartz-crystal blank 17 so as to function as close-contact layers of the outer electrodes 97 and 98, the excitation electrodes 100 and 101, and the extended conductors 102 and 103 for the surfaces of the quartz-crystal blank 17. Alternatively, it is noted that, instead of the chrome layers, different metal layers such as titanium layers may be used as the close-contact layers.

As further shown in FIG. 3, for example, the crystal resonator element 16 is mounted on the top surface 12A of the substrate 12. More specifically, the outer electrode 22 and the outer electrode 97 are fixed in place in a state of being electrically connected to each other by an electrically-conductive joining member 210, and the outer electrode 26 and the outer electrode 98 are fixed in place in a state of being electrically connected to each other by an electrically-conductive joining member 212. As a result, the crystal resonator element 16 is caused to be supported on the substrate 12 by the electrically-conductive joining members 210 and 212. The material of each of the electrically-conductive joining members 210 and 212 is, for example, an epoxy-based-resin base material containing an electrically-conductive material filler, such as an AG filler in an exemplary aspect.

(Method of Manufacturing Crystal Resonator)

A method of manufacturing the crystal resonator 10 according to an exemplary aspect will be described below with reference to the drawings.

First, the cap 14 is fabricated. A flat metal plate is prepared. The metal plate is formed, by drawing using press-working, into a shape having the main-surface 14a, the annular portion 14b (except the groove 13), and the flange 14c. This operation is a common process, and thus, description thereof will be omitted. After that, the groove 13 is formed in the band-shaped region B. The groove 13 can be formed by, for example, pressing a blade-shaped pressing die against the band-shaped region B. As a result, manufacture of the cap 14 is completed.

Next, the substrate 12 is fabricated. A source substrate that includes a plurality of substrate main bodies 21 arranged in a matrix is prepared. The source substrate is made of the same material as the substrate main body 21, and examples of the material include a ceramic-based insulating material such as an aluminum oxide sintered compact, a mullite sintered compact, an aluminum nitride sintered compact, a silicon carbide sintered compact, or a glass ceramic sintered compact, a quartz crystal, glass, and silicon, for example.

Subsequently, circular through holes (i.e., via holes) are formed in the source substrate by radiating a beam onto positions at which the via conductors 32 and 34 are to be formed. Then, the via conductors 32 and 34 are embedded in the through holes.

After that, base electrodes of the outer electrodes 40, 42, 44, and 46 are formed onto the bottom surface of the source substrate. More specifically, a molybdenum layer is printed onto the bottom surface of the source substrate and dried. Then, the molybdenum layer is sintered. As a result, the base electrodes of the outer electrodes 40, 42, 44, and 46 are formed.

Subsequently, base electrodes of the outer electrodes 22 and 26 are formed onto the top surface of the source substrate. More specifically, a molybdenum layer is printed onto the top surface of the source substrate and dried. Then, the molybdenum layer is sintered. As a result, the base electrodes of the outer electrodes 22 and 26 are formed.

Next, nickel plating and gold plating are performed in this order on the base electrodes of the outer electrodes 40, 42, 44, 46, 22, and 26. As a result, the outer electrodes 40, 42, 44, 46, 22, and 26 are formed.

Subsequently, the source substrate is divided into the plurality of substrate main bodies 21 by using a dicer. It is noted that the source substrate may be divided into the plurality of substrate main bodies 21 after forming a dividing groove into the source substrate by radiating a laser beam onto the source substrate. As a result, manufacture of the substrate 12 is completed.

The crystal resonator element 16 is then fabricated. A rectangular plate-shaped quartz-crystal blank 17 is obtained by being cut out from quartz-crystal ore in the AT-cut manner. In addition, beveling is performed on the quartz-crystal blank 17 by using a barrel-finishing apparatus as necessary. As a result, ridge-line portions of the quartz-crystal blank 17 are ground away.

Next, the outer electrodes 97 and 98, the extended conductors 102 and 103, and the excitation electrodes 100 and 101 are formed on the surfaces of the quartz-crystal blank 17. It is noted that formation of the outer electrodes 97 and 98, the excitation electrodes 100 and 101, and the extended conductors 102 and 103 is a common process, and thus, description thereof will be omitted. By performing this process, manufacture of the crystal resonator element 16 is completed.

Subsequently, the crystal resonator element 16 is mounted onto the top surface 12A of the substrate 12. More specifically, as illustrated in FIG. 2 and FIG. 3, the outer electrode 22 and the outer electrode 97 are joined to each other by the electrically-conductive joining member 210, and the outer electrode 26 and the outer electrode 98 are joined to each other by the electrically-conductive joining member 212.

Then, the holding unit 11 is hermetically sealed. The brazing-alloy member 30 is sandwiched between the bottom surface of the flange 14c and the edge portion of the top surface 12A of the substrate 12. In this state, the brazing-alloy member 30 is heated together with the cap 14 and the substrate 12, so that the brazing-alloy member 30 melts. After that, the brazing-alloy member 30 is cooled together with the cap 14 and the substrate 12, so that the brazing-alloy member 30 is solidified. As a result, the holding unit 11 is hermetically sealed. Manufacture of the crystal resonator 10 is completed through the above processes.

Advantageous Effects

As will be described below, when the crystal resonator 10 according to the present embodiment is mounted onto a mother substrate by using a mounter or mounting device, for example, a joint between the cap 14 and the substrate 12 is durable and does not easily break during manufacture or operation.

Figure 9:
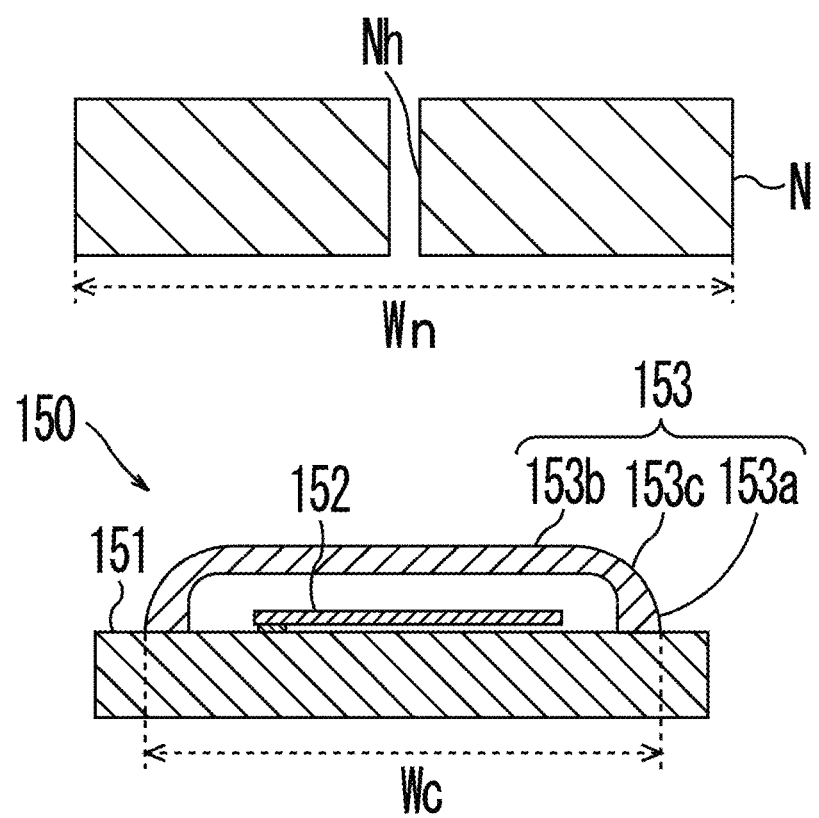
FIG. 9 is a diagram illustrating the sectional structure of a crystal resonator 150 of the related art.

When the crystal resonator 10 is mounted onto a mother substrate, the crystal resonator 10 is held by a nozzle N of a mounter (see FIG. 9). A width Wn of the bottom surface (e.g., a surface of the nozzle N that faces the cap 14) of the nozzle is set to be larger than the width (the length in a direction parallel to the bottom surface 15A) of the cap 14 of the crystal resonator 10. In this case, substantially the entire top surface of the main-surface 14a is brought into contact with the bottom surface of the nozzle N. In this state, the crystal resonator 10 is pressed against the mother substrate by the nozzle N. When the crystal resonator 10 is pressed, the cap 14 receives a force from the nozzle N.

It is noted that the width Wn of the bottom surface of the nozzle N may be equal to or smaller than the width of the cap 14 of the crystal resonator 10. In addition, the nozzle N is not limited to a block having a pore such as that illustrated in FIG. 9 and may be, for example, a tubular nozzle (a nozzle having a ring-shaped cross section). In both cases, advantageous effects that will be described below can be obtained.

The force applied to the cap 14 from the nozzle N is transmitted to the annular portion 14b. Conventionally, such a force becomes a cause of breakage of the joint portion between the cap 14 and the substrate 12. Accordingly, in the band-shaped region B of the annular portion 14b, the groove 13 is formed so as to extend in the circumferential direction of the annular portion 14b. As a result, the force applied to the cap 14 from the nozzle N is transmitted across the groove 13 while being transmitted from the main-surface 14a to the joint (or connection) between the cap 14 and the substrate 12. In the band-shaped region B of the annular portion 14b, the surface profile changes in a continuous manner in a portion excluding the groove 13. In contrast, in the band-shaped region B of the annular portion 14b, the surface profile sharply changes in a discontinuous manner in the groove 13. As a result, the stress that is generated in the band-shaped region B is significantly larger in the vicinity of the groove 13 than in a region that is not in the vicinity of the groove 13. In other words, the stress is concentrated in the vicinity of the groove 13. Accordingly, the stress that is generated at the joint between the cap 14 (e.g., the flange 14c) and the substrate 12 is small. Therefore, the joint is durable and does not easily break.

When the groove 13 is a V-groove, the surface profile at the bottom of the groove 13 changes to an extremely large extent. As a result, the stress is notably concentrated at the bottom of the groove 13, and thus, the above-described advantageous effect may easily be obtained.

As a result of the stress being concentrated in the vicinity of the groove 13, the annular portion 14b may be deformed such that the groove 13 is closed. In this case, an impact generated when the crystal resonator 10 is pressed against the mother substrate by the nozzle N can be absorbed. Also because of this, the joint does not easily break. It is noted that, in this case, the cap 14 does not come into contact with the crystal resonator element 16 after the annular portion 14b has been deformed.

In the case where the groove 13 is formed in a region that includes at least one of (and preferably both) the intermediate portion M1 of the long side Ls1 and the intermediate portion M2 of the long side Ls2 (see, e.g., FIG. 5) when the cap 14 is viewed in the vertical direction, the effect of absorbing impact by deformation may easily be obtained. This is because, when the cap 14 is viewed in the vertical direction, portions in the vicinity of the intermediate portions M1 and M2 are each farthest from the corners of the annular portion 14b and may easily be deformed, whereas portions in the vicinity of the corners of the annular portion 14b have high rigidity and are less likely to be deformed.

In the case where the groove 13 is formed in a region of the outer peripheral surface of the annular portion 14b excluding the band-shaped region B, that is, in the case where the groove 13 is located above the bottom surface 15A of the main-surface 14a in the vertical direction, deformation does not easily occur in the portion of the annular portion 14b in the vicinity of the groove 13. In this case, only a small effect of absorbing impact, which has been mentioned above, is obtained.

Since the groove 13 is formed in the outer peripheral surface of the annular portion 14b, the presence of the groove 13 may easily be confirmed by visual observation.

In the following description, which refers to FIG. 6 to FIG. 8, components and portions that are the same as the components and the portions illustrated in FIG. 1 to FIG. 5 are denoted by the same reference signs, and repeated descriptions will be not be provided.

Figure 6:
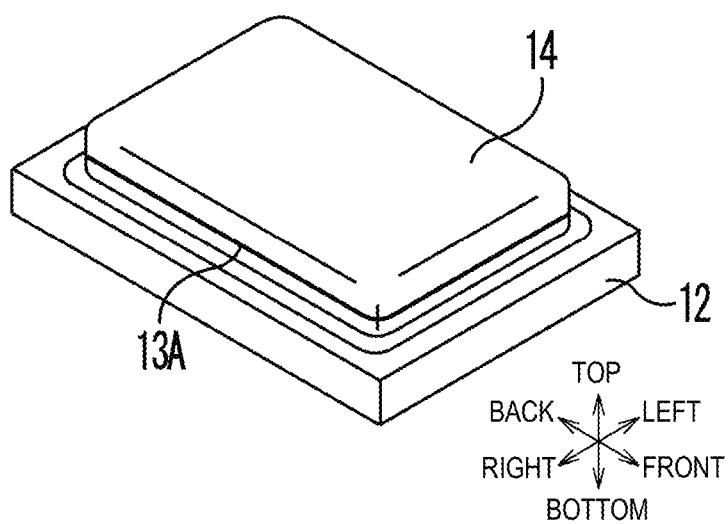
FIG. 6 is an external perspective view of a crystal resonator 10A.

FIG. 6 is an external perspective view of a crystal resonator 10A according to a first modification of the exemplary embodiment. In the band-shaped region B of the crystal resonator 10A, a groove 13A is continuously formed along the whole periphery of the annular portion 14b in the circumferential direction of the annular portion 14b. Thus, description of the configuration of the crystal resonator 10A, excluding the groove 13A, will be omitted.

Figure 7:
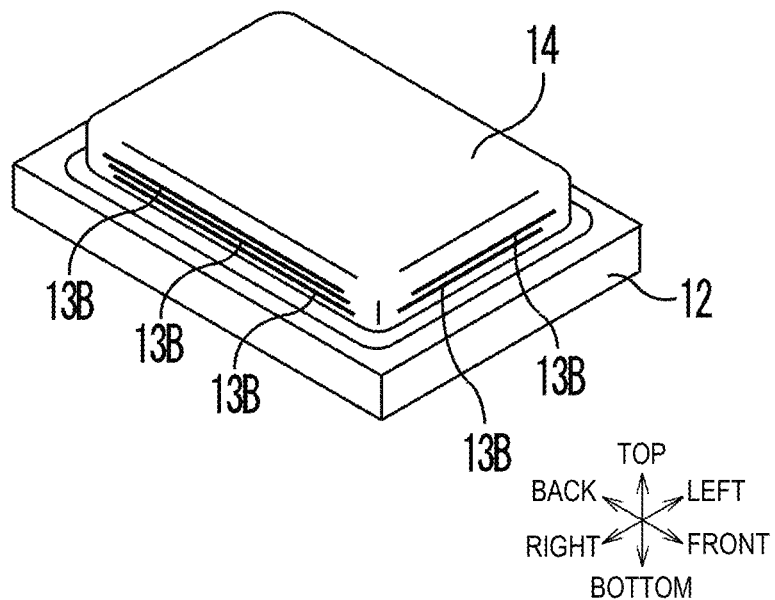
FIG. 7 is an external perspective view of a crystal resonator 10B.

FIG. 7 is an external perspective view of a crystal resonator 10B according to a second modification of the exemplary embodiment. In the band-shaped region B of the crystal resonator 10B, a plurality of grooves 13B are formed in at least one of the surfaces including the long sides Ls1 and Ls2 and the surfaces including the short sides Ss1 and Ss2 (in this modification, three of the grooves 13B are formed in the surface including the long side Ls1, and two of the grooves 13B are formed in the surface including the short side Ss1). In this case, the plurality of grooves 13B that are formed in the same surface may be or may not be displaced from one another in the longitudinal direction or the transverse direction as illustrated in FIG. 7. Thus, description of the configuration of the crystal resonator 10B, excluding the grooves 13B, will be omitted.

Figure 8:
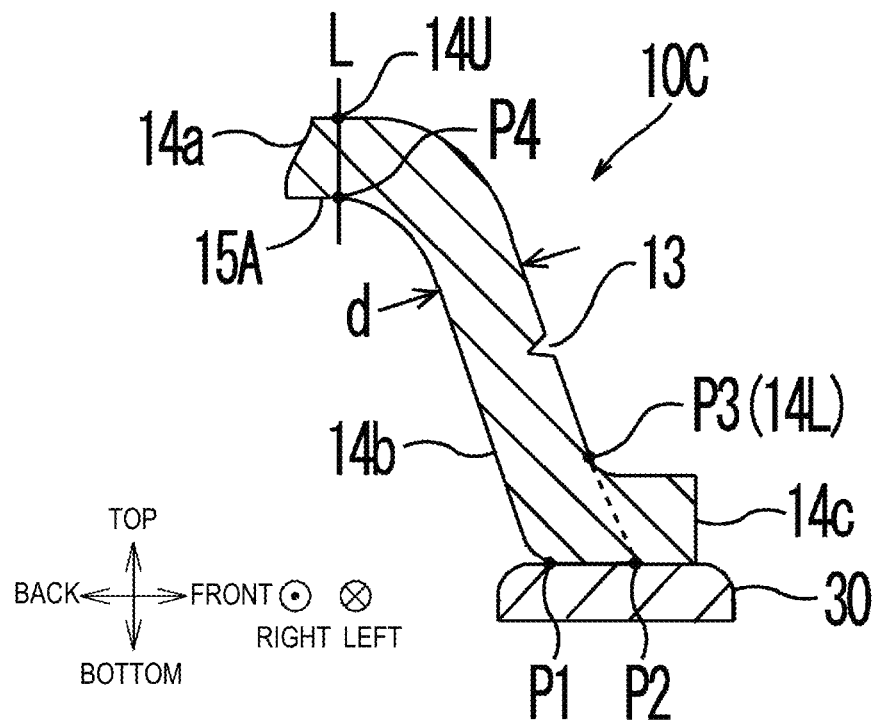
FIG. 8 is a diagram illustrating the sectional structure of a crystal resonator 10C.

FIG. 8 is a diagram illustrating the sectional structure of a crystal resonator 10C according to a third modification of the exemplary embodiment and illustrates a portion in the vicinity of the annular portion 14b in an enlarged manner. In the crystal resonator 10C, the annular portion 14b is inclined such that a lower portion thereof is located further toward the outside than an upper portion thereof is. As described above, the annular portion 14b does not need to be perpendicular to the main-surface 14a. Also in this case, the boundary between the annular portion 14b and the flange 14c, the boundary between the annular portion 14b and the main-surface 14a, the outer peripheral surface of the annular portion 14b, the upper-end-side edge 14U and the lower-end-side edge 14L of the outer peripheral surface of the annular portion 14b, and so forth are defined similarly to those in the embodiment illustrated in FIG. 4.

Additional Exemplary Embodiments

It is noted that the electronic component according to the exemplary embodiment described above is not limited to the above-described crystal resonators 10, 10A, 10B, and 10C, and changes may be made within the gist of the present invention. For example, the grooves 13, 13A, and 13B can be formed in at least one of the surfaces including the long-sides Ls1 and Ls2 and the surfaces including the short-sides Ss1 and Ss2 and are not necessarily formed in all the surfaces.

Moreover, the cap 14 does not necessarily include flange 14c. In this case, the lower-end-side edge 14L of the outer peripheral surface of the annular portion 14b is the lower end of the outer surface of the cap 14 (e.g., a portion adjacent to the brazing-alloy member 30). The band-shaped region B becomes a wide region between the bottom surface 15A of the main-surface 14a and the lower end of the annular portion 14b (e.g., the portion adjacent to the brazing-alloy member 30) in the vertical direction, and the grooves 13, 13A, and 13B can be formed at arbitrary positions in this region.

It is further noted that the element that is accommodated in the recess may be a control IC, a thermistor, a capacitor, or the like, as would be appreciated to one skilled in the art.

Moreover, the exemplary configurations of the above-described embodiments can be arbitrarily combined within the scope of the invention.

Finally, as further described above, the exemplary embodiments of the present invention are useful in an electronic component that includes a metal cap and is particularly favorable in that a joint between a cap and a substrate is durable and does not easily break when an electronic component is mounted onto a mother substrate using a mounter, for example.

REFERENCE SIGNS LIST 10, 10A, 10B, 10C crystal resonator
11 holding unit
12 substrate
12A top surface
13, 13A, 13B groove
14 cap
14a main-surface portion
14b annular portion
14c flange
15 recess
15A bottom surface
16 crystal resonator element
17 quartz-crystal blank
21 substrate main body
30 brazing-alloy member
100, 101 excitation electrode 210, 212 electrically-conductive joining member
B band-shaped region
Ls1, Ls2 long-side portion
M1, M2, M3, M4 intermediate portion
Spa space
Ss1, Ss2 short-side portion

The invention claimed is:

1. An electronic component comprising:
a metal cap including a first main surface having a flat plate-like shape with an inner surface and an annular portion that surrounds the inner surface when viewed in a direction perpendicular to the first main surface, such that the first main surface and the annular portion form a recess;
a substrate having a flat plate-like shape with a main surface that hermetically seals the recess;
a joining member that joins the metal cap to the substrate; and
an element disposed in the recess,
wherein the annular portion comprises an outer peripheral surface with a band-shaped region between the inner surface and the main surface of the substrate,
wherein a groove is disposed in the band-shaped region and extends in a circumferential direction of the annular portion of the metal cap,
wherein the band-shaped region of the annular portion has a thickness in a direction parallel to the first main surface that is thinner where the groove is disposed than where the groove is not disposed in the band-shaped region,
wherein the metal cap includes a flange that projects from an opening edge of the annular portion in a direction along the main surface of the substrate, and
wherein a portion of the band-shaped region extends from the flange towards the first main surface, such that the portion of the band-shaped region extends between the flange and the groove.

2. The electronic component according to claim 1, wherein the outer peripheral surface extends in a direction perpendicular between the main surface of the substrate and the inner surface of the cap.

3. The electronic component according to claim 1, wherein the flange extends towards an outside of the recess.

4. The electronic component according to claim 1, wherein the annular portion has a rectangular shape having a pair of long sides and a pair of short sides when viewed in a direction perpendicular to the inner surface of the cap.

5. The electronic component according to claim 4, wherein, when viewed in the direction perpendicular to the inner surface of the cap, the groove is disposed in a region including an intermediate portion of each of the pair of long sides of the annular portion.

6. The electronic component according to claim 1, wherein the groove comprises a V shape comprising two inner-wall surfaces to define an acute angle in a cross section perpendicular to a direction in which the groove extends.

7. The electronic component according to claim 6, wherein the joining member is formed between the cap and the substrate and the groove is configured to absorb a stress impact when the cap is mounted to the substrate to form the joining member.

8. The electronic component according to claim 1, further comprising a brazing-alloy member configured to couple the substrate to the cap.

9. The electronic component according to claim 1, wherein the element comprises a crystal resonator.

10. The electronic component according to claim 1, wherein the band-shaped region of the annular portion has a same thickness that is uniform in the direction parallel to the first main surface of the metal cap both above and below a position where the groove is disposed.

11. An electronic component comprising:
a metal cap including a main surface having and an annular portion that surrounds the main surface of the metal cap to define a recess;
a substrate having a flat plate-like shape that defines a main surface thereof;
a joining member that joins the main surface of the metal cap to the main surface of the substrate; and
a groove disposed in an outer peripheral surface of the annular portion and that extends in a circumferential direction of the annular portion of the metal cap;
wherein the annular portion has a thickness in a direction parallel to the main surface of the metal cap that is thinner where the groove is disposed than where the groove is not disposed in the annular portion,
wherein the metal cap includes a flange that projects from an opening edge of the annular portion in a direction along the main surface of the substrate, and
wherein the groove is disposed at a position of the band-shaped region that is away from a position where the flange extends from the annular portion.

12. The electronic component according to claim 11, further comprising an element disposed in the recess.

13. The electronic component according to claim 12, wherein the element comprises a crystal resonator.

14. The electronic component according to claim 11, wherein the outer peripheral surface extends in a direction perpendicular between the main surface of the substrate and the main surface of the cap.

15. The electronic component according to claim 11, wherein the flange extends towards an outside of the recess.

16. The electronic component according to claim 11, wherein the annular portion has a rectangular shape having a pair of long sides and a pair of short sides when viewed in a direction perpendicular to the main surface of the cap.

17. The electronic component according to claim 16, wherein, when viewed in the direction perpendicular to the main surface of the cap, the groove is disposed in a region including an intermediate portion of each of the pair of long sides of the annular portion.

18. The electronic component according to claim 11, wherein the groove comprises a V shape comprising two inner-wall surfaces to define an acute angle in a cross section perpendicular to a direction in which the groove extends.

19. The electronic component according to claim 18, wherein the joining member is formed between the cap and the substrate and the groove is configured to absorb a stress impact when the cap is mounted to the substrate to form the joining member.

20. The electronic component according to claim 11, wherein the band-shaped region of the annular portion has a same thickness that is uniform in the direction parallel to the first main surface of the metal cap both above and below a position where the groove is disposed.

* * * * *